(12) United States Patent
Dornauer et al.

(10) Patent No.: US 7,773,369 B2
(45) Date of Patent: Aug. 10, 2010

(54) COOLING ARRANGEMENT FOR ELECTRICAL COMPONENTS ARRANGED IN A HOUSING OF A SOFT STARTER, AND A SOFT STARTER

(75) Inventors: Marco Dornauer, Heroldsberg (DE); Norbert Reichenbach, Amberg (DE)

(73) Assignee: Siemens Aktiengesellschaft, Munich (DE)

( * ) Notice: Subject to any disclaimer, the term of this patent is extended or adjusted under 35 U.S.C. 154(b) by 32 days.

(21) Appl. No.: 12/007,864

(22) Filed: Jan. 16, 2008

(65) Prior Publication Data
US 2008/0180886 A1    Jul. 31, 2008

(30) Foreign Application Priority Data
Jan. 17, 2007    (DE) .................... 10 2007 003 329

(51) Int. Cl.
*H05K 7/20*    (2006.01)
(52) U.S. Cl. .................. 361/676; 361/23; 361/103; 361/694; 361/695; 454/184; 318/370; 318/376
(58) Field of Classification Search .......... 361/23–34, 361/103, 147, 605, 641–647, 690–697, 717, 361/778; 324/117, 117 H, 207.2, 207.14; 454/184; 165/80.2, 80.3, 104.33, 104.34, 165/121–126, 185; 318/376, 370, 778–790, 318/430, 432, 138, 254, 439, 471, 400.22, 318/400.37
See application file for complete search history.

(56) References Cited

U.S. PATENT DOCUMENTS

| | | | |
|---|---|---|---|
| 4,459,638 A * | 7/1984 | Brehm et al. ............... 361/697 |
| 4,520,425 A * | 5/1985 | Ito ............................ 361/697 |
| 5,091,823 A * | 2/1992 | Kanbara et al. ............. 361/697 |
| 5,670,936 A * | 9/1997 | Estes et al. .................. 340/501 |
| 5,774,353 A * | 6/1998 | Wieloch ..................... 363/146 |
| 6,087,800 A * | 7/2000 | Becker et al. ............... 318/778 |
| 6,144,556 A * | 11/2000 | Lanclos ...................... 361/695 |
| 6,183,214 B1 * | 2/2001 | Ko ............................. 417/360 |
| 6,249,435 B1 * | 6/2001 | Vicente et al. .............. 361/717 |
| 6,315,656 B1 * | 11/2001 | Pawlowski .................. 454/184 |
| 6,375,561 B1 * | 4/2002 | Nicolai et al. .............. 454/184 |
| 6,695,978 B2 * | 2/2004 | Worrall et al. ......... 252/299.62 |
| 6,856,503 B2 * | 2/2005 | Apfelbacher et al. ........ 361/676 |
| 7,012,800 B2 * | 3/2006 | Busch et al. ................ 361/605 |
| 7,031,156 B2 * | 4/2006 | Naiva et al. ................ 361/695 |
| 7,149,064 B2 * | 12/2006 | Nolden et al. ................ 361/23 |
| 7,238,104 B1 * | 7/2007 | Greenslade et al. ......... 454/184 |
| 2004/0109293 A1 | 6/2004 | Apfelbacher et al. |

(Continued)

FOREIGN PATENT DOCUMENTS

DE    103 30 315 A1    2/2005

(Continued)

*Primary Examiner*—Michael V Datskovskiy
(74) *Attorney, Agent, or Firm*—Harness, Dickey & Pierce, P.L.C.

(57) ABSTRACT

A cooling arrangement is disclosed for electrical components which are arranged in a housing of a soft starter which in particular may be designed for operation of an electric motor. In at least one embodiment, the cooling arrangement includes at least one fan arranged inclined in an opening in a housing wall such that the rotation axis of the fan is at an angle to the normal to the housing wall.

13 Claims, 3 Drawing Sheets

U.S. PATENT DOCUMENTS

2007/0082598 A1  4/2007  Kempf et al.
2007/0159861 A1  7/2007  Meier et al.

FOREIGN PATENT DOCUMENTS

| DE | 20 2005 004448 | U1 | | 6/2005 |
|---|---|---|---|---|
| DE | 10 2004 017292 | A1 | | 10/2005 |
| JP | 09275658 | A | * | 10/1997 |
| WO | WO 01/86681 | A1 | | 11/2001 |

* cited by examiner

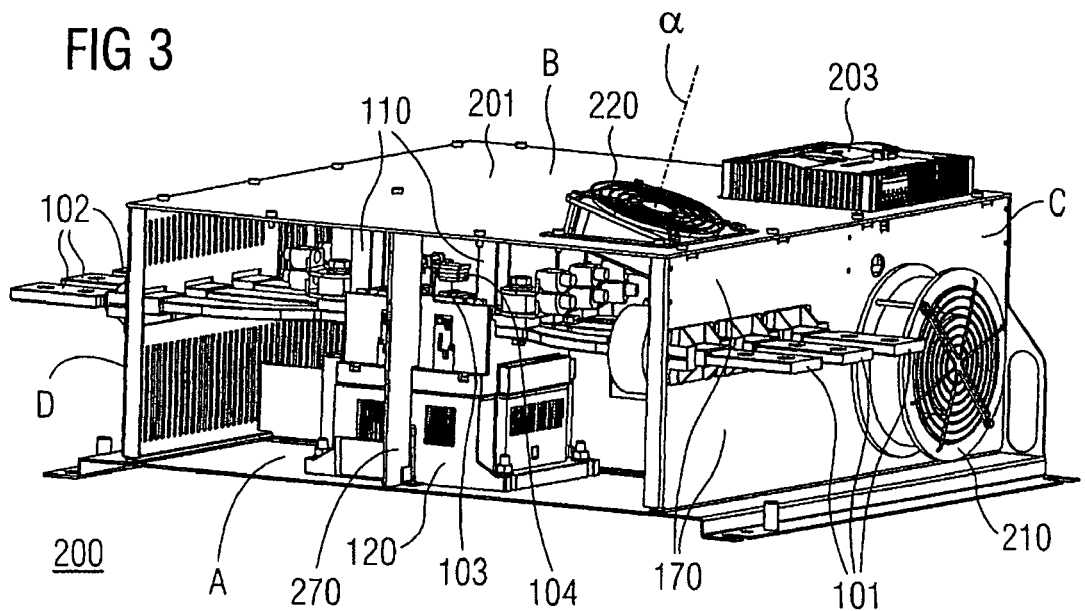
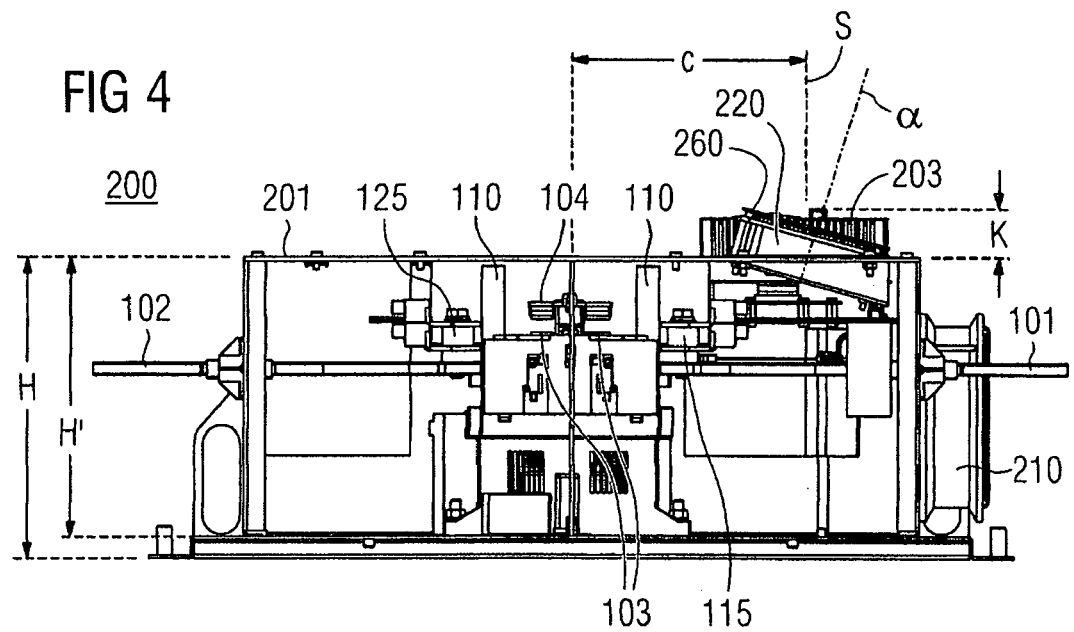

COOLING ARRANGEMENT FOR ELECTRICAL COMPONENTS ARRANGED IN A HOUSING OF A SOFT STARTER, AND A SOFT STARTER

PRIORITY STATEMENT

The present application hereby claims priority under 35 U.S.C. §119 on German patent application number DE 10 2007 003 329.1 filed Jan. 17, 2007, the entire contents of which is hereby incorporated herein by reference.

FIELD

Embodiments of the invention generally relate to cooling arrangements for electrical components of a soft starter, and to soft starters.

BACKGROUND

Modern soft starters, as illustrated in FIG. 1, include a semiconductor power section for motor starting and a bridging section for carrying current during the operating phase. The bridging section may, for example, be formed by a mechanical contactor. The bridging section considerably reduces the electrical losses during the operating phase, thus allowing the appliance dimensions to be reduced and the cooling measures provided by the user to be reduced. In older soft starters, the bridging section comprises a contactor with an arc quenching chamber.

Suitable driving of the semiconductor section and the bridging section by way of a control section allows arc formation to be virtually avoided when the current changes from the semiconductor section to the bridging section, and vice versa. The bridging section can therefore also be designed without an arc quenching chamber, thus considerably reducing the costs, the dimensions and the weight. One embodiment of the mentioned design is explained in more detail in international application, PCT/EP2005/012441, which was not published prior to this application, but whose contents are hereby incorporated herein by reference, in their entirety.

The cooling effect can be further improved by at least one fan which blows a cooling air flow over the current path, and preferably also over the cooling measures. The fan is preferably sufficiently large to allow an adequate cooling air flow to be produced. Furthermore, the fan is preferably placed such that the air flow flows around and cools the current paths and cooling measures which enlarge the surface areas, as optimally as possible. The fan is therefore preferably fitted to the housing cover B of the soft starter.

In the event of a fault or if the drive for the semiconductor section by the control section does not operate accurately, it is possible for an arc to be formed in the bridging section. In order to prevent the flashover from damaging the fan, the fan must be further away from the bridging section, thus increasing the appliance volume, in particular the height. This is disadvantageous, because it can reduce the customer attractiveness of the soft starter.

SUMMARY

In at least one embodiment of the invention, better cooling of an electrical appliance is permitted without having to make the electrical appliance very much higher.

In at least one embodiment, if the cooling apparatus or the soft starter has at least one fan which is installed inclined in the housing and is designed to produce a fluid flow from outside the housing to the electrical components to be cooled, which act as at least potential appliance-internal heat sources during operation, the increase in the appliance volume can be avoided better by a larger installation depth. The fan can preferably be mounted inclined such that its rotation axis is at an angle to the normal to the housing wall or the housing cover.

If the at least one potential appliance-internal heat source has at least one switching point which is designed to interrupt an electric current, the at least one switching point can be cooled.

At least one embodiment of the invention also advantageously works with at least one switching point which is designed to interrupt an electric current without using an arc quenching chamber. In this case, the damage to the fan by a switching arc can be better avoided by the inclined installation.

In particular, the fan can then be mounted further away from the at least one switching point, thus allowing smaller appliance dimensions. The cooling effect can be improved by directing the rotation axis at or inclining it with respect to the switching point.

If the at least one potential appliance-internal heat source has at least one current path, the cooling effect can be improved without having to significantly increase the physical size of the electrical appliance.

If the fan were to be mounted in the housing cover B, as marked in FIG. 1, in order to directly cool the at least one current path from above, the housing height would have to be increased. If the fan were to be mounted with a rotation axis running parallel to the at least one current path in the housing wall C, as marked in FIG. 1, the appliance height might also have to be increased because, in addition to the fan, there may be a further space requirement in order to allow the soft starter to make electrical contact with a possible load or a power supply.

If the fan is placed at a distance from the at least one current path, or if the rotation axis is directed at or is at an angle to the at least one current path, any possibility of damage to the fan resulting from movement of the switching arc which may possibly occur elsewhere and emerges along the at least one current path can be better avoided.

If the at least one current path has a surface and the rotation axis is selected such that the fan produces a fluid flow along the surface, the cooling effect of the current path can be further improved, particularly if the surface is essentially flat, since this allows better creation of an unimpeded fluid flow.

The electrical appliance is preferably a soft starter having at least one semiconductor power section and having at least one bridging section without an arc quenching chamber. In this case, the bridging section forms the at least one potential appliance-internal heat source. An embodiment according to the invention makes it possible to avoid the complex grounding and metallic shielding of the fan required because of the high short-circuit currents that occur with normal physical sizes, thus making it possible to save complexity and costs. Furthermore, the mounting of the fan at a greater distance directly above the points to be cooled can be avoided, thus also making it possible to avoid the undesirable increase in the installation depth of the appliance.

BRIEF DESCRIPTION OF THE DRAWINGS

The invention will be described in more detail in the following text with reference to the example embodiments in FIGS. 1 to 4, in which:

FIG. 3 shows a perspective illustration of an electrical appliance, and

FIG. 4 shows a longitudinal section through the electrical appliance illustrated in FIG. 3.

The same reference symbols denote the same structural features in all the figures.

DETAILED DESCRIPTION OF THE EXAMPLE EMBODIMENTS

Figure 1:
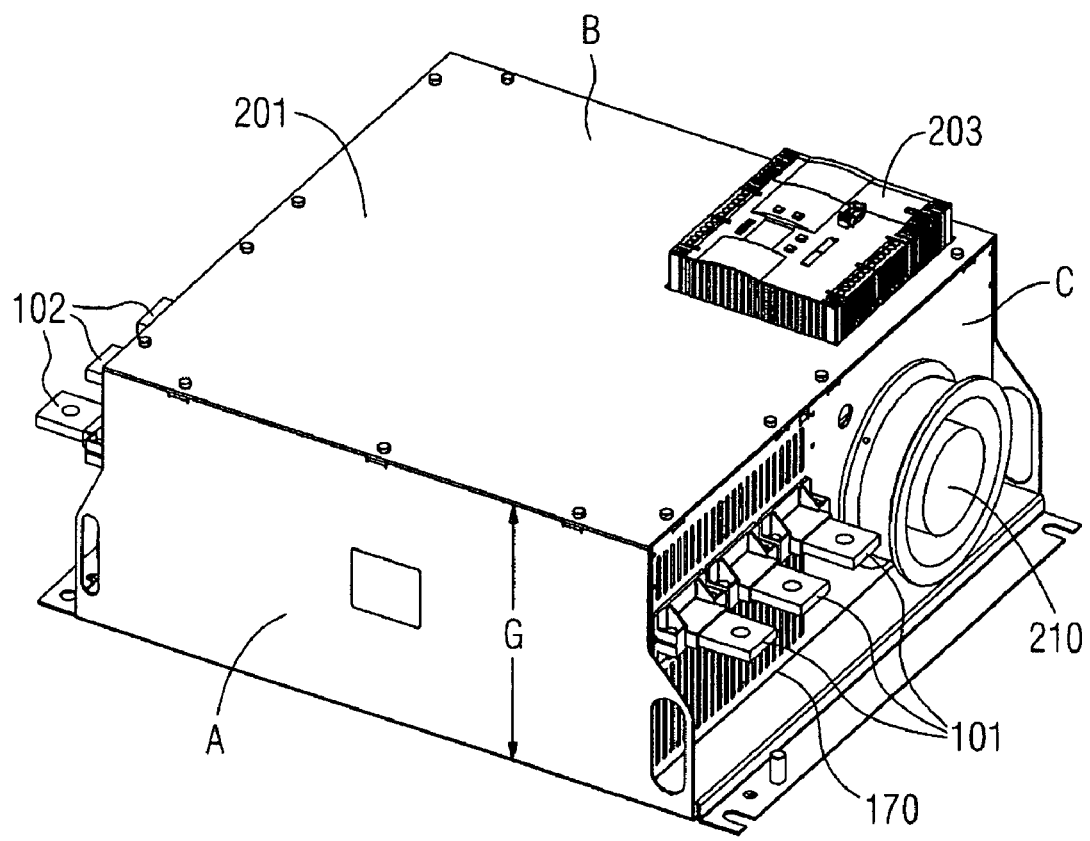
FIG. 1 shows a soft starter from the prior art.

The terminology used herein is for the purpose of describing particular embodiments only and is not intended to be limiting of the present invention. As used herein, the singular forms "a", "an", and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein are interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present invention.

In describing example embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner.

Referencing the drawings, wherein like reference numerals designate identical or corresponding parts throughout the several views, example embodiments of the present patent application are hereafter described. Like numbers refer to like elements throughout. As used herein, the terms "and/or" and "at least one of" include any and all combinations of one or more of the associated listed items.

FIG. 1 shows a soft starter 200 for three-phase applications. The soft starter is enclosed in a housing 201 and is connected by way of electrical inputs 102 to the power supply and by way of electrical outputs 101 to one or more loads, for example a motor.

The rear face of the housing 201 is preferably attached to the wall, so that the front face or the housing cover B of the housing 201 then preferably runs parallel to that wall. In the mounted position, the electrical inputs 102 points upward and the lower face C with the electrical outputs 101 points downward. The side wall A then remains at right angles to the base, in a preferred manner.

The soft starter 200 has a semiconductor power section, a control section 203 and a bridging section. The control section 203 controls the change between the semiconductor power section and the bridging section such that starting and run-down are controlled by the semiconductor power section, while the current is passed via the bridging section when stationary and during operation. The semiconductor section is blown directly by a fan 210 whose blowing direction is preferably from bottom upwards.

Fundamentally, the aim is to use a single bridging section for as wide a current range as possible, in order to keep the variation between the housing embodiments as small as possible.

Figure 2:
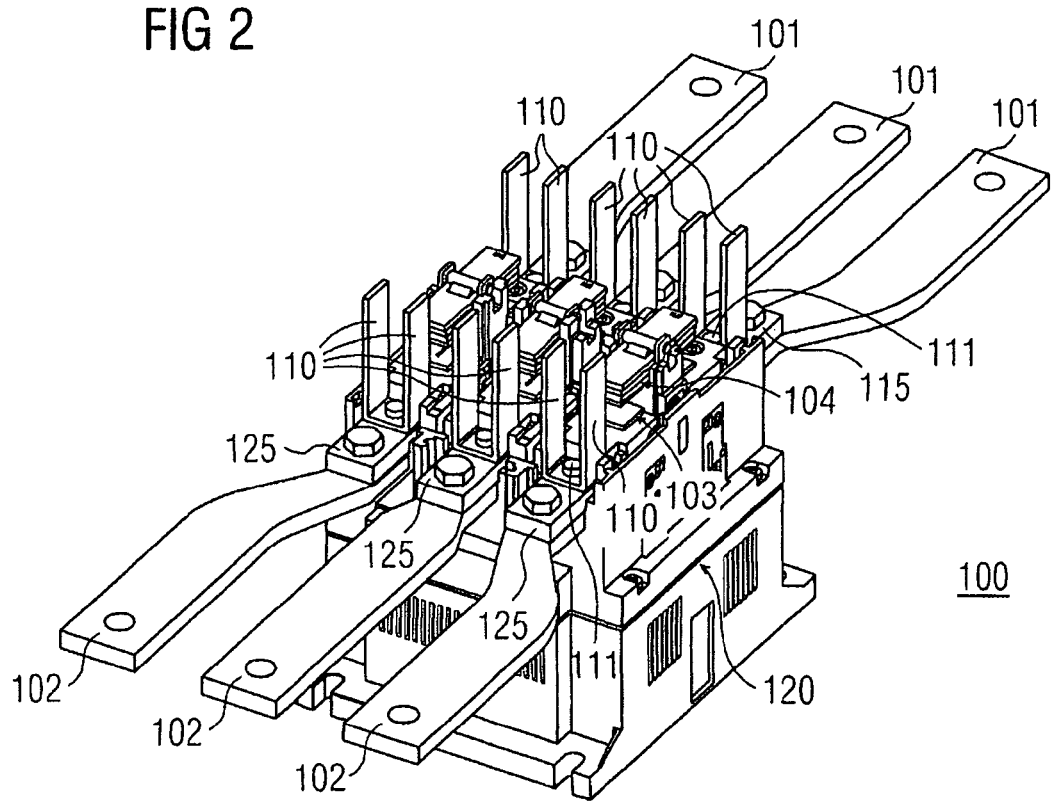
FIG. 2 shows a bridging section without an arc quenching chamber.

FIG. 2 shows one possible bridging section 100, whose maximum permissible current is governed by the maximum permissible heating of the metal parts that carry the current, and these are also referred to as current paths 115, 125. The moving switching pieces 104 are controlled by the drive mechanism that is mounted in the cap 210 such that they move towards or away from the fixed switching pieces 103 and thus electrically conductively connect and disconnect the current paths 115, 125.

Since the bridging section 100 does not have an arcing chamber, it is possible by improved cooling of the current paths 115, 125 to increase the maximum permissible current without exceeding the maximum permissible heating. Measures 110 to increase surface areas can then be used close to the fixed switching piece 103.

By way of example, possible measures 110 to increase surface areas include metal sheets or cooling ribs to increase surface areas, which are attached to the current paths 115, 125, preferably by means of at least one attachment element 111 such as a screw or a bolt. A number of embodiment options relating to the cooling measures are described in more detail in DE 10 2006 057 814.7, the entire contents of which are hereby incorporated herein by reference.

The moving and fixed switching pieces 103, 104 and the busbars 115, 125 are heated during operation. The cooling measures 110, which may optionally be used are also heated during operation. The moving and the fixed switching pieces 103, 104, the busbars 115, 125 and optionally, the cooling measures 110 as well, act as appliance-internal heat sources.

FIG. 3 shows a perspective illustration of a soft starter 200 with the bridging section 100 from FIG. 2, and with a fan 220 in order to cool it. FIG. 4 shows a side view of the soft starter. The side wall A has been removed both in FIG. 3 and in FIG. 4.

The obliquely installed fan 220 preferably blows directly onto the busbars 115 of the output-side electrical connections 101. The rotation axis a of the fan 220 is not at right angles to the housing cover B or to the housing wall, but is at an angle to the normal S.

The inclined installation position of the fan 220 results during operation in an airflow over the measures 110 which enlarge the surface area and the current paths 115, 125 towards the busbars with the input-side electrical connection 102. The heated air passes through the perforated input-side appliance wall D to the outside, thus ensuring that the heat losses from the bridging section 100 are transported away from the soft starter 200. Since the fan 220 ensures cooling, the lower face C may be designed without any perforation 170.

In order to avoid possible damage to the fan 220 and in order not to enlarge the appliance dimensions H, H', the fan 220 is preferably positioned only just at an angle such that its uppermost edge 260 is no higher than the highest point of the control section 203, that is to say the dimension K in FIG. 4 governs the installation angle.

An air guide plate 270, which is arranged at the side of the bridging section 100, prevents parts of the air flow from flowing in the direction of the busbars 102 of the input-side connection without flowing around the busbars 115, 125 and the heat sinks 110 and adequately cooling them. Instead of one air guide plate 270, it is also possible to use two or more air guide plates, very possibly also on both sides of the bridging section 100.

The inclined installation of the fan 220 in the housing cover B allows the fan 220 to be placed at an adequate distance c from the bridging section 100, thus avoiding or reducing the risk of arc flashovers onto the fan 220.

This fan placing allows a sufficiently good cooling effect to be achieved to allow the current for the bridging section 100 to be increased by about 20 to 40% with the increase being 25% in one specific case. In this case, the appliance height H need not differ significantly from the old size for a soft starter without an additional fan.

Soft Starter

Although embodiments of the invention have been described using examples, it is self-evident to a person skilled in the art that this does not form any restriction. In fact, embodiments of the invention can be designed on the basis of the patent claims. In particular, the fan may be in the form of a blower, and some other appropriate fluid may also be used as a coolant, instead of air.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A cooling arrangement for electrical components arranged in a housing of a soft starter, comprising:
   at least one fan, arranged inclined in an opening in a housing wall of the housing such that a rotation axis of the fan is at an angle to a normal to the housing wall.

2. The cooling arrangement as claim 1, wherein the electrical components to be cooled include a switching point, and wherein the switching point is designed to interrupt an electric current.

3. A soft starter comprising:
   a housing;
   a plurality of electrical components within the housing as heat sources;
   at least one cooling arrangement to cool the plurality of electrical components; and
   at least one fan, arranged inclined in an opening in a housing wall of the housing such that a rotation axis of the at least one fan is at an angle to a normal to the housing wall.

4. The soft starter as claimed in claim 3, wherein the electrical components to be cooled, as a potential appliance-internal heat source, comprise at least one switching point designed to interrupt an electric current.

5. The soft starter as claimed in claim 4, wherein the at least one fan is located at a distance from the at least one switching point.

6. The soft starter as claimed in claim 4, wherein the rotation axis is directed at or is at an angle to the at least one switching point.

7. The soft starter as claimed in claim 3, wherein the soft starter has at least one current path including a surface, and wherein the rotation axis is selected such that the at least one fan produces a fluid flow along the surface during operation.

8. The soft starter as claimed in claim 7, wherein the surface is essentially flat.

9. The soft starter as claimed in claim 3, wherein the soft starter includes at least one semiconductor power section, a control section and at least one bridging section without an arc quenching chamber, wherein the bridging section includes the plurality of electrical components to be cooled and which act as a potential appliance-internal heat source during operation.

10. The cooling arrangement of claim 1, designed for operation of an electric motor.

11. The soft starter as claimed in claim 5, wherein the rotation axis is directed at or is at an angle to the at least one switching point.

12. The soft starter as claimed in claim 7, wherein the soft starter includes at least one semiconductor power section, a control section and at least one bridging section without an arc quenching chamber, wherein the bridging section includes the plurality of electrical components to be cooled and which act as a potential appliance-internal heat source during operation.

13. The soft starter as claimed in claim 8, wherein the soft starter includes at least one semiconductor power section, a control section and at least one bridging section without an arc quenching chamber, wherein the bridging section includes the plurality of electrical components to be cooled and which act as a potential appliance-internal heat source during operation.

* * * * *